US009950520B2

(12) United States Patent
Ge et al.

(10) Patent No.: US 9,950,520 B2
(45) Date of Patent: Apr. 24, 2018

(54) PRINTHEAD HAVING A NUMBER OF SINGLE-DIMENSIONAL MEMRISTOR BANKS

(71) Applicant: HEWLETT-PACKARD DEVELOPMENT COMPANY, L.P., Houston, TX (US)

(72) Inventors: Ning Ge, Palo Alto, CA (US); Leong Yap Chia, Singapore (SG); Pin Chin Lee, Singapore (SG)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 15/516,648

(22) PCT Filed: Oct. 28, 2014

(86) PCT No.: PCT/US2014/062632
§ 371 (c)(1),
(2) Date: Apr. 3, 2017

(87) PCT Pub. No.: WO2016/068880
PCT Pub. Date: May 6, 2016

(65) Prior Publication Data
US 2017/0291414 A1 Oct. 12, 2017

(51) Int. Cl.
*B41J 2/175* (2006.01)
*B41J 2/045* (2006.01)
*B41J 2/135* (2006.01)

(52) U.S. Cl.
CPC ......... *B41J 2/04581* (2013.01); *B41J 2/0458* (2013.01); *B41J 2/04541* (2013.01);
(Continued)

(58) Field of Classification Search
CPC .. B41J 2/04581; B41J 2/0458; B41J 2/04541; B41J 2/04543; B41J 2/1753; B41J 2/17546; B41J 2/135; B41J 2/04573
(Continued)

(56) References Cited

U.S. PATENT DOCUMENTS 8,882,217 B2 * 11/2014 Lea ..................... B41J 2/1753
347/58
9,776,400 B2 * 10/2017 Ge ....................... B41J 2/04541
(Continued)

FOREIGN PATENT DOCUMENTS

WO WO-2014084843 A1 6/2014

OTHER PUBLICATIONS

Xu, C., et al., Reliability-Aware Cross-Point Resistive Memory Design, GLSVLSI'14, May 21-23, 2014, pp. 145-150.

*Primary Examiner* — An Do
(74) *Attorney, Agent, or Firm* — Fabian VanCott

(57) ABSTRACT

A printhead having a number of single-dimensional memristor banks is described. The printhead includes a number of nozzles to deposit an amount of fluid onto a print medium. Each nozzle includes a firing chamber to hold the amount of fluid, an opening to dispense the amount of fluid onto the print medium, and an ejector to eject the amount of fluid through the opening. The printhead also includes a number of single-dimensional memristor banks. Each memristor bank includes a number of memristors arranged in a single dimension and a number of serially-connected de-multiplexers to selectively activate a target memristor of the memristor bank. The number of serially-connected de-multiplexers is equal to the number of memristors and an output of at least one de-multiplexer is an input into a subsequent de-multiplexer.

15 Claims, 8 Drawing Sheets

(52) U.S. Cl.
CPC ............. *B41J 2/135* (2013.01); *B41J 2/1753* (2013.01); *B41J 2/17546* (2013.01); *B41J 2202/17* (2013.01)

(58) Field of Classification Search
USPC ............................ 347/12, 20, 40, 45, 47, 86
See application file for complete search history.

(56) References Cited

U.S. PATENT DOCUMENTS

| | | | |
|---|---|---|---|
| 9,847,132 B1* | 12/2017 | Zheng | ................. G11C 15/046 |
| 2004/0041584 A1 | 3/2004 | Sunaga et al. | |
| 2006/0082815 A1 | 4/2006 | Walker | |
| 2013/0054886 A1 | 2/2013 | Eshraghian et al. | |
| 2013/0106930 A1 | 5/2013 | Lea et al. | |
| 2013/0175497 A1 | 7/2013 | Yang et al. | |
| 2013/0278656 A1 | 10/2013 | Govyadinov et al. | |
| 2014/0138610 A1 | 5/2014 | Gaidis et al. | |
| 2014/0241030 A1 | 8/2014 | Fukuzumi et al. | |

* cited by examiner

1

PRINTHEAD HAVING A NUMBER OF SINGLE-DIMENSIONAL MEMRISTOR BANKS

BACKGROUND

A memory system may be used to store data. In some examples, imaging devices, such as printheads may include memory to store information relating to printer cartridge identification, security information, and authentication information, among other types of information.

BRIEF DESCRIPTION OF THE DRAWINGS

The accompanying drawings illustrate various examples of the principles described herein and are a part of the specification. The illustrated examples do not limit the scope of the claims.

Throughout the drawings, identical reference numbers designate similar, but not necessarily identical, elements.

DETAILED DESCRIPTION

Figure 1:
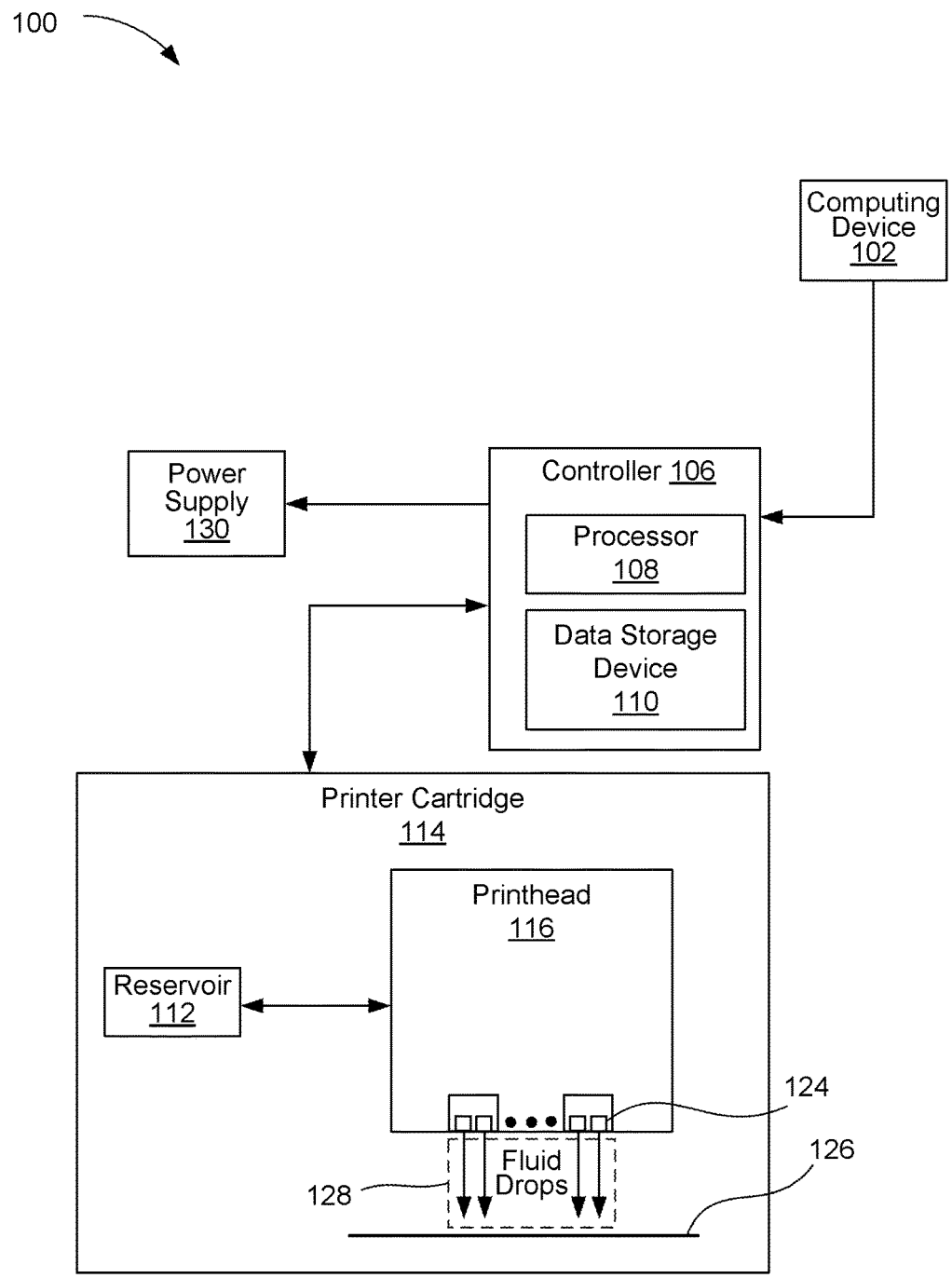
FIG. 1 is a diagram of a printing system according to one example of the principles described herein.

Memory devices are used to store information for a printer cartridge. Printer cartridges include memory to store information related to the operation of the printhead. For example, a printhead may include memory to store information related 1) to the printhead; 2) to fluid, such as ink, used by the printhead; or 3) to the use and maintenance of the printhead. Other examples of information that may be stored on a printhead include information relating to 1) a fluid supply, 2) fluid identification information, 3) fluid characterization information, and 4) fluid usage data, among other types of fluid or imaging device related data. More examples of information that may be stored include identification information, serial numbers, security information, feature information, Anti-Counterfeiting (ACF) information, among other types of information. While memory usage on printheads is desirable, changing circumstances may reduce their efficacy in storing information.

For example, an increasing trend in counterfeiting may lead to current memory storage devices being too small to contain sufficient anti-counterfeiting information and security and authentication information. Additionally, with loyalty customer reward programs, new business models and other customer relation management programs through cloud-printing and other printing architectures, additional market data, customer appreciation value information, encryption information, and other types of information on the rise, a manufacturer may desire to store more information on a memory device.

Moreover, as new technologies develop, circuit space becomes more valuable. Accordingly, it may be desirable for the greater amounts of data storage to occupy less space within a device. Memristors may be used due to their non-volatility, low operational power consumption characteristics, and their compact size. A memristor selectively stores data based on a resistance state of the memristor. For example, a memristor may be in a low resistance state indicated by a "1," or a high resistance state indicated by a "0." Memristors may form a string of ones and zeroes that will store the aforementioned data. If an analog memristor is used, there may be many different resistance states.

A memristor may switch between a low resistance state and a high resistance state during a switching event in which a voltage is applied across the memristor. Each memristor has a switching voltage that refers to a voltage used to switch the state of the memristors. When the supplied voltage is greater than the memristor switching voltage, the memristor switches state. While memristors may be beneficial as memory storage devices, their use presents a number of complications.

For example, as described above, space on printheads may be at a premium. This may further be exacerbated by the dimensions of the printhead. More specifically, some printheads may be such that a large array of memristors may not fit on the printhead without significant restructuring of the printhead. Restructuring which may be expensive and require a design change to an entire printhead line.

Accordingly, the present specification describes a printhead and printer cartridge that alleviate this and other complications. Specifically, the present specification describes a printhead that includes a number of single-dimensional memristor banks such that the memristor array may fit on a thin printhead. Each memristor bank may include a row or column of memristors and a number of serially-connected de-multiplexers disposed side by side with the memristors.

More specifically, the present disclosure describes a printhead having a number of single-dimensional memristor banks. The printhead includes a number of nozzles to deposit an amount of fluid onto a print medium. Each nozzle includes a firing chamber to hold the amount of fluid, an opening to dispense the amount of fluid onto the print medium, and an ejector to eject the amount of fluid through the opening. The printhead also includes a number of single-dimensional memristor banks. Each memristor bank includes a number of memristors arranged in a single dimension and a number of serially-connected de-multiplexers to selectively activate a target memristor of a memristor bank. The number of serially-connected de-multiplexers is equal to the number of memristors and an output of at least one de-multiplexer is an input into a subsequent de-multiplexer.

The present disclosure also describes a printer cartridge having a number of single-dimensional memristor banks. The printer cartridge includes a fluid supply and a printhead to deposit fluid from the fluid supply onto a print medium. The printhead includes a number of single-dimensional memristor banks. Each single-dimensional memristor bank includes a number of memristors and a number of serially-connected de-multiplexers to selectively activate a target memristor of a memristor bank. Each de-multiplexer is independently paired with one of the number of memristors and an output of at least one de-multiplexer is an input into a subsequent de-multiplexer.

As used in the present specification and in the appended claims, the term "printer cartridge" may refer to a device used in the ejection of ink, or other fluid, onto a print medium. In general, a printer cartridge may be a fluidic ejection device that dispenses fluid such as ink, wax, polymers or other fluids. A printer cartridge may include a printhead. In some examples, a printhead may be used in printers, graphic plotters, copiers, and facsimile machines. In these examples, a printhead may eject ink, or another fluid, onto a medium such as paper to form a desired image or a desired three-dimensional geometry.

Accordingly, as used in the present specification and in the appended claims, the term "printer" is meant to be understood broadly as any device capable of selectively placing a fluid onto a print medium. In one example the printer is an inkjet printer. In another example, the printer is a three-dimensional printer. In yet another example, the printer is a digital titration device.

Still further, as used in the present specification and in the appended claims, the term "fluid" is meant to be understood broadly as any substance that continually deforms under an applied shear stress. In one example, a fluid may be a pharmaceutical. In another example, the fluid may be an ink. In another example, the fluid may be a liquid.

Still further, as used in the present specification and in the appended claims, the term "print medium" is meant to be understood broadly as any surface onto which a fluid ejected from a nozzle of a printer cartridge may be deposited. In one example, the print medium may be paper. In another example, the print medium may be an edible substrate. In yet one more example, the print medium may be a medicinal pill.

Even further, as used in the present specification and in the appended claims, the term "memristor" may refer to a passive two-terminal circuit element that maintains a functional relationship between the time integral of current, and the time integral of voltage.

Even further, as used in the present specification and in the appended claims, the term "de-multiplexer module" may refer to a component that receives a single input and generates a number of outputs. A de-multiplexer module may include a number of de-multiplexers such as shift registers, D latches, and flip-flops to pass a single control signal and generate a number of outputs.

Yet further, as used in the present specification and in the appended claims, the term "a number of" or similar language may include any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Turning now to the figures, FIG. 1 is a diagram of a printing system (100) according to one example of the principles described herein. In some examples, the printing system (100) is included on a printer. The system (100) includes an interface with a computing device (102). The interface enables the system (100), and specifically the processor (108), to interface with various hardware elements, such as the computing device (102), external and internal to the system (100). Other examples of external devices include external storage devices, network devices such as servers, switches, routers, and client devices among other types of external devices.

In general, the computing device (102) may be any source from which the system (100) may receive data describing a job to be executed by the controller (106) in order to eject fluid onto the print medium (126). For example, via the interface, the controller (106) receives data from the computing device (102) and temporarily stores the data in the data storage device (110). Data may be sent to the controller (106) along an electronic, infrared, optical, or other information transfer path. The data may represent a document and/or file to be printed. As such, data forms a job and includes job commands and/or command parameters.

A controller (106) includes a processor (108), a data storage device (110), firmware, software, and other electronics for communicating with and controlling the printhead (116). The controller (106) receives data from the computing device (102) and temporarily stores data in the data storage device (110).

The controller (106) controls the printhead (116) in ejecting fluid from the nozzles (124). For example, the controller (106) defines a pattern of ejected fluid drops that form characters, symbols, and/or other graphics or images on the print medium (126). The pattern of ejected fluid drops is determined by the print job commands and/or command parameters received from the computing device (102). The controller (106) may be an application specific integrated circuit (ASIC), on a printer for example, which determines the level of fluid in the printhead (116) based on resistance values of memristors integrated on the printhead (116). The ASIC may include a current source and an analog to digital converter (ADC). The ASIC converts a voltage present at the current source to determine a resistance of a memristor, and then determines a corresponding digital resistance value through the ADC. Computer readable program code, executed through executable instructions enables the resistance determination and the subsequent digital conversion through the ADC.

The processor (108) may include the hardware architecture to retrieve executable code from the data storage device (110) and execute the executable code. The executable code may, when executed by the processor (108), cause the processor (108) to implement at least the functionality of ejecting fluid onto the print medium (126). The executable code may, when executed by the processor (108), cause the processor (108) to implement the functionality of providing instructions to the power supply (130) such that the power supply (130) provides power to the components of the system (100).

The data storage device (110) may store data such as executable program code that is executed by the processor (108) or other processing device. The data storage device (110) may specifically store computer code representing a number of applications that the processor (108) executes to implement at least the functionality described herein.

Generally, the data storage device (110) may include a computer readable medium, a computer readable storage medium, or a non-transitory computer readable medium, among others. For example, the data storage device (110) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The printing system (100) includes a printer cartridge (114) that includes a printhead (116) and a reservoir (112). The printer cartridge (114) may be removable from the system (100) for example, as a replaceable printer cartridge (114).

The printer cartridge (114) includes a printhead (116) that ejects drops of fluid through a plurality of nozzles (124) towards a print medium (126). The print medium (126) may be any type of suitable sheet or roll material, such as paper, card stock, transparencies, polyester, plywood, foam board, fabric, canvas, and the like. In another example, the print medium (126) may be an edible substrate. In yet one more example, the print medium (126) may be a medicinal pill.

Nozzles (124) may be arranged in columns or arrays such that properly sequenced ejection of fluid from the nozzles (124) causes characters, symbols, and/or other graphics or images to be printed on the print medium (126) as the printhead (116) and print medium (126) are moved relative to each other. In one example, the number of nozzles (124) fired may be a number less than the total number of nozzles (124) available and defined on the printhead (116).

The printhead (116) may include memory elements to store information on the printhead (116). For example, the printhead (116) may include an array of memristors. Specifically, the printhead (116) may include a number of single-dimensional memristor banks. Each memristor in the bank may be independently paired with a de-multiplexer which also is in a single-dimensional orientation. Using a single-dimensional memristor bank may be beneficial in that it may be used on a thin printhead where larger matrix arrays may not fit without significant restructuring of the printhead (116).

The printer cartridge (114) also includes a fluid reservoir (112) to supply an amount of fluid to the printhead (116). In general, fluid flows between the reservoir (112) and the printhead (116). In some examples, a portion of the fluid supplied to printhead (116) is consumed during operation and fluid not consumed during printing is returned to the reservoir (112).

In some examples, a mounting assembly positions the printhead (116) relative to media transport assembly, and media transport assembly positioning the print medium (126) relative to printhead (116). Thus, a print zone (128), indicated by the dashed box, is defined adjacent to the nozzles (124) in an area between the printhead (116) and the print medium (126). In one example, the printhead (116) is a scanning type printhead (116). As such, the mounting assembly includes a carriage for moving the printhead (116) relative to the media transport assembly to scan the print medium (126). In another example, the printhead (116) is a non-scanning type printhead (116). As such, the mounting assembly fixes the printhead (116) at a prescribed position relative to the media transport assembly. Thus, the media transport assembly positions the print medium (126) relative to the printhead (116).

Figure 2A:
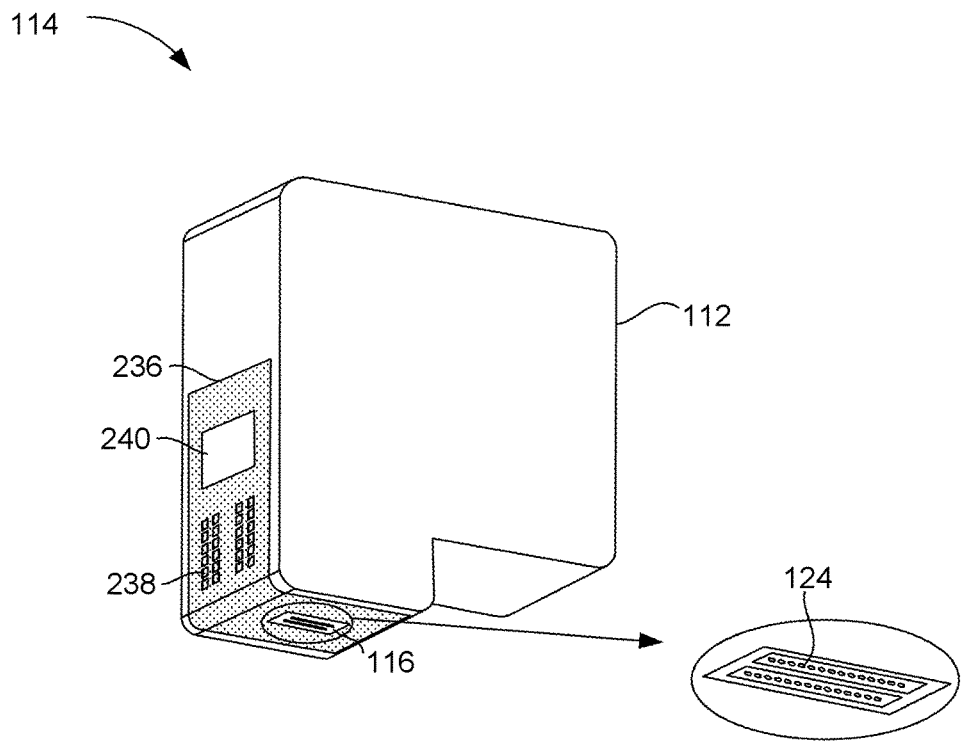
FIG. 2A is a diagram of a printer cartridge that uses a printhead having a number of single-dimensional memristor banks according to one example of the principles described herein.
Figure 2B:
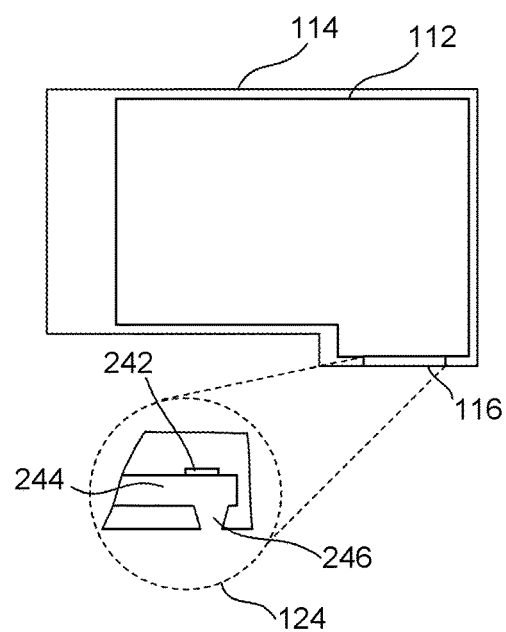
FIG. 2B is a cross sectional diagram of a printer cartridge that uses a printhead having a number of single-dimensional memristor banks according to one example of the principles described herein.

FIG. 2A is a diagram of a printer cartridge (114) and printhead (116) having a number of single-dimensional memristor banks according to one example of the principles described herein. As discussed above, the printhead (116) may include a number of nozzles (124). In some examples, the printhead (116) may be broken up into a number of print dies with each die having a number of nozzles (124). The printhead (116) may be any type of printhead (116) including, for example, a printhead (116) as described in FIGS. 2A and 2B. The examples shown in FIGS. 2A and 2B are not meant to limit the present description. Instead, various types of printheads (116) may be used in conjunction with the principles described herein.

The printer cartridge (114) also includes a fluid reservoir (112), a flexible cable (236), conductive pads (238), and a memristor array (240). The flexible cable (236) is adhered to two sides of the printer cartridge (114) and contains traces that electrically connect the memristor array (240) and printhead (116) with the conductive pads (238).

The printer cartridge (114) may be installed into a cradle. When the printer cartridge (114) is correctly installed into a device such as a printer, the conductive pads (238) are pressed against corresponding electrical contacts in the cradle, allowing the device to communicate with, and control the electrical functions of, the printer cartridge (114). For example, the conductive pads (238) allow the device to access and write to the memristor array (240).

The memristor array (240) may contain a variety of information including the type of printer cartridge (114), the kind of fluid contained in the printer cartridge (114), an estimate of the amount of fluid remaining in the fluid reservoir (112), calibration data, error information, and other data. In one example, the memristor array (240) may include information regarding when the printer cartridge (114) should be maintained. The memristor array (240) may include other information as described below in connection with FIG. 3. The memristor array (240) may include a number of single-dimension memristor banks having independently paired and similarly single-dimensional de-multiplexers.

To eject fluid, the system (FIG. 1, 100) moves the carriage containing the printer cartridge (114) relative to a print medium (FIG. 1, 126). At appropriate times, the system (FIG. 1, 100) sends electrical signals to the printer cartridge (114) via the electrical contacts in the cradle. The electrical signals pass through the conductive pads (238) and are routed through the flexible cable (236) to the printhead (116). The printhead (116) then ejects a small droplet of fluid from the reservoir (112) onto the surface of the print medium (FIG. 1, 126).

The printhead (116) may include any number of nozzles (124). In an example where the fluid is an ink, a first subset of nozzles (124) may eject a first color of ink while a second subset of nozzles (124) may eject a second color of ink. Additional groups of nozzles (124) may be reserved for additional colors of ink.

FIG. 2B is a cross sectional diagram of a printer cartridge (114) and printhead (116) having a number of single-dimensional memristor banks according to one example of the principles described herein. The printer cartridge (114) may include a fluid supply (112) that supplies the fluid to the printhead (116) for deposition onto a print medium. In some examples, the fluid may be ink. For example, the printer cartridge (114) may be an inkjet printer cartridge, the printhead (116) may be an inkjet printhead, and the ink may be inkjet ink.

The printer cartridge (114) may include a printhead (116) to carry out at least a part of the functionality of depositing a fluid onto a print medium (FIG. 1, 126). For example the printhead may have a number of single-dimensional memristor banks.

The printhead (116) may include a number of components for depositing a fluid onto a print medium (FIG. 1, 126). For example, the printhead (116) may include a number of nozzles (124). For simplicity, FIG. 2B indicates a single nozzle (124); however a number of nozzles (124) are present on the printhead (116). A nozzle (124) may include an ejector (242), a firing chamber (244), and an opening (246). The opening (246) may allow fluid, such as ink, to be deposited onto a surface, such as a print medium (FIG. 1, 126). The firing chamber (244) may include a small amount of fluid. The ejector (242) may be a mechanism for ejecting fluid through an opening (246) from a firing chamber (244), where the ejector (242) may include a firing resistor or other thermal device, a piezoelectric element, or other mechanism for ejecting fluid from the firing chamber (244).

For example, the ejector (242) may be a firing resistor. The firing resistor heats up in response to an applied voltage. As the firing resistor heats up, a portion of the fluid in the firing chamber (244) vaporizes to form a bubble. This bubble pushes liquid fluid out the opening (246) and onto the print medium (FIG. 1, 126). As the vaporized fluid bubble pops, a vacuum pressure within the firing chamber (244) draws fluid into the firing chamber (244) from the fluid supply (112), and the process repeats. In this example, the printhead (116) may be a thermal inkjet printhead.

In another example, the ejector (242) may be a piezoelectric device. As a voltage is applied, the piezoelectric device changes shape which generates a pressure pulse in the firing chamber (244) that pushes a fluid out the opening (246) and onto the print medium (FIG. 1, 126). In this example, the printhead (116) may be a piezoelectric inkjet printhead.

The printhead (116) and printer cartridge (114) may also include other components to carry out various functions related to fluidic ejection. For simplicity, in FIGS. 2A and 2B, a number of these components and circuitry included in the printhead (116) and printer cartridge (114) are not indicated; however such components may be present in the printhead (116) and printer cartridge (114). In some examples, the printer cartridge (114) is removable from a printing system for example, as a disposable printer cartridge.

Figure 3:
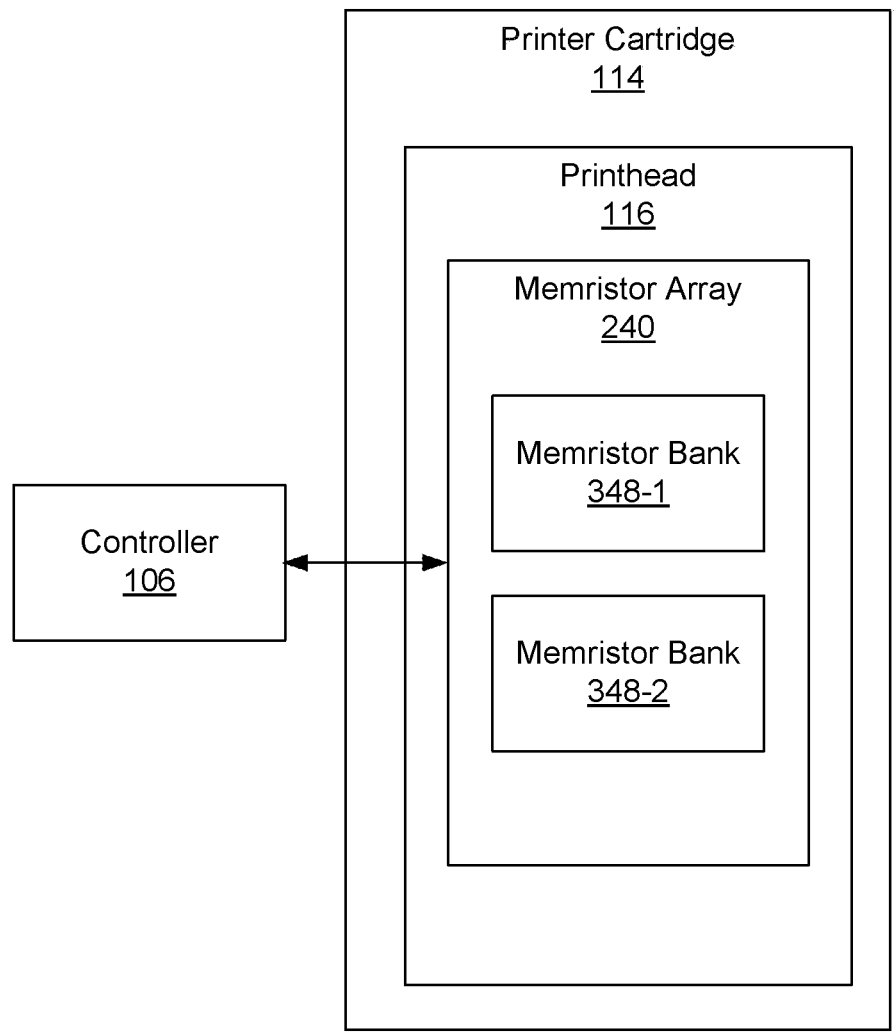
FIG. 3 is a block diagram of a printer cartridge that uses a printhead having a number of single-dimensional memristor banks according to one example of the principles described herein.

FIG. 3 is a block diagram of a printer cartridge (114) that uses a printhead (116) having a number of single-dimensional memristor banks (348-1, 348-2) according to one example of the principles described herein. In some examples, the printer cartridge (114) includes a printhead (116) that carries out at least a part of the functionality of the printer cartridge (114). For example, the printhead (116) may include a number of nozzles (FIG. 1, 124). The printhead (116) ejects drops of fluid from the nozzles (FIG. 1, 124) onto a print medium (FIG. 1, 126) in accordance with a received print job. The printhead (116) may also include other circuitry to carry out various functions related to printing. In some examples, the printhead (116) is part of a larger system such as an integrated printhead (IPH). The printhead (116) may be of varying types. For example, the printhead (116) may be a thermal inkjet (TIJ) printhead or a piezoelectric inkjet (PIJ) printhead, among other types of printhead (116).

The printhead (116) includes a memristor array (240) to store information relating to at least one of the printer cartridge (114) and the printhead (116). In some examples, the memristor array (240) includes a number of memristor banks (348-1, 348-2) formed in the printhead (116). A memristor bank (348) includes a number of memristors. To store information, a memristor within each memristor bank (348) may be set to a particular resistance state. As memristors are non-volatile, this resistance state is retained even when power is removed from the printhead (116). A memristor has a metal-insulator-metal layered structure. More specifically, the memristor may include a bottom electrode (metal), a switching oxide (insulator), and a top electrode (metal).

As will be described in more detail below, the memristor banks (348) of the present specification may be single-dimensional, meaning that the memristors within the memristor bank (348) are aligned in a single row or column. Similarly, each memristor bank (348) may include a number of serially-connected de-multiplexers, in which the number of serially-connected de-multiplexers equals the number of memristors within each memory bank (348). The serially-connected de-multiplexers may similarly be single-dimensional, meaning that the de-multiplexers are aligned in a single row or column. The single-dimensional memristors and single-dimensional de-multiplexers may be parallel. For example, the memristors may be aligned in a single row and the de-multiplexers may be aligned in another row that is adjacent to the row of memristors. In this fashion, the memristor banks (348) may be substantially longer than they are wide and therefore accommodate placement of the memristor array (240) onto a thin printhead (116) without restructuring to the printhead (116).

The number of memristor banks (348) are grouped together into a memristor array (240). In one example, each memristor may be formed at an intersection of a first set of elements and a second set of elements, the elements forming a grid of intersecting nodes, each node defining a memristor.

The memristor array (240) may be used to store any type of data. Examples of data that may be stored in the memristor array (240) include fluid supply specific data and/or fluid identification data, fluid characterization data, fluid usage data, printhead (116) specific data, printhead (116) identification data, warranty data, printhead (116) characterization data, printhead (116) usage data, authentication data, security data, Anti-Counterfeiting data (ACF), fluid drop weight, firing frequency, initial printing position, acceleration information, and gyro information, among other forms of data. In a number of examples, the memristor array (240) is written at the time of manufacturing and/or during the operation of the printer cartridge (114).

In some examples, the printer cartridge (114) may be coupled to a controller (106). The controller (106) receives a control signal from an external computing device (FIG. 1, 102). The controller (106) may be an Application-Specific Integrated Circuit (ASIC), for example, a printer ASIC. A computing device (FIG. 1, 102) may send a job to the printer cartridge (114), the job being made up of text, images, or combinations thereof to be deposited onto a print medium (FIG. 1, 126). The controller (106) may facilitate storing information to the memristor array (240). Specifically, the controller (106) may pass at least one control signal to the number of memristors. For example, the controller (106) may be coupled to the printhead (116), via a control line such as an identification line. Via the identification line, the controller (106) may change the resistance state of a number of memristors in the memristor array (240) to effectively store information to a memristor array (240). For example, the controller (106) may send data such as authentication data, security data, and job data, in addition to other types of data to the printhead (116) to be stored on the memristor array (240).

While specific reference is made to an identification line, the controller (106) may share a number of lines of communication with the printhead (116), such as data lines, clock lines, and fire lines. For simplicity, in FIG. 3 the different communication lines are indicated by a single arrow.

Figure 4A:
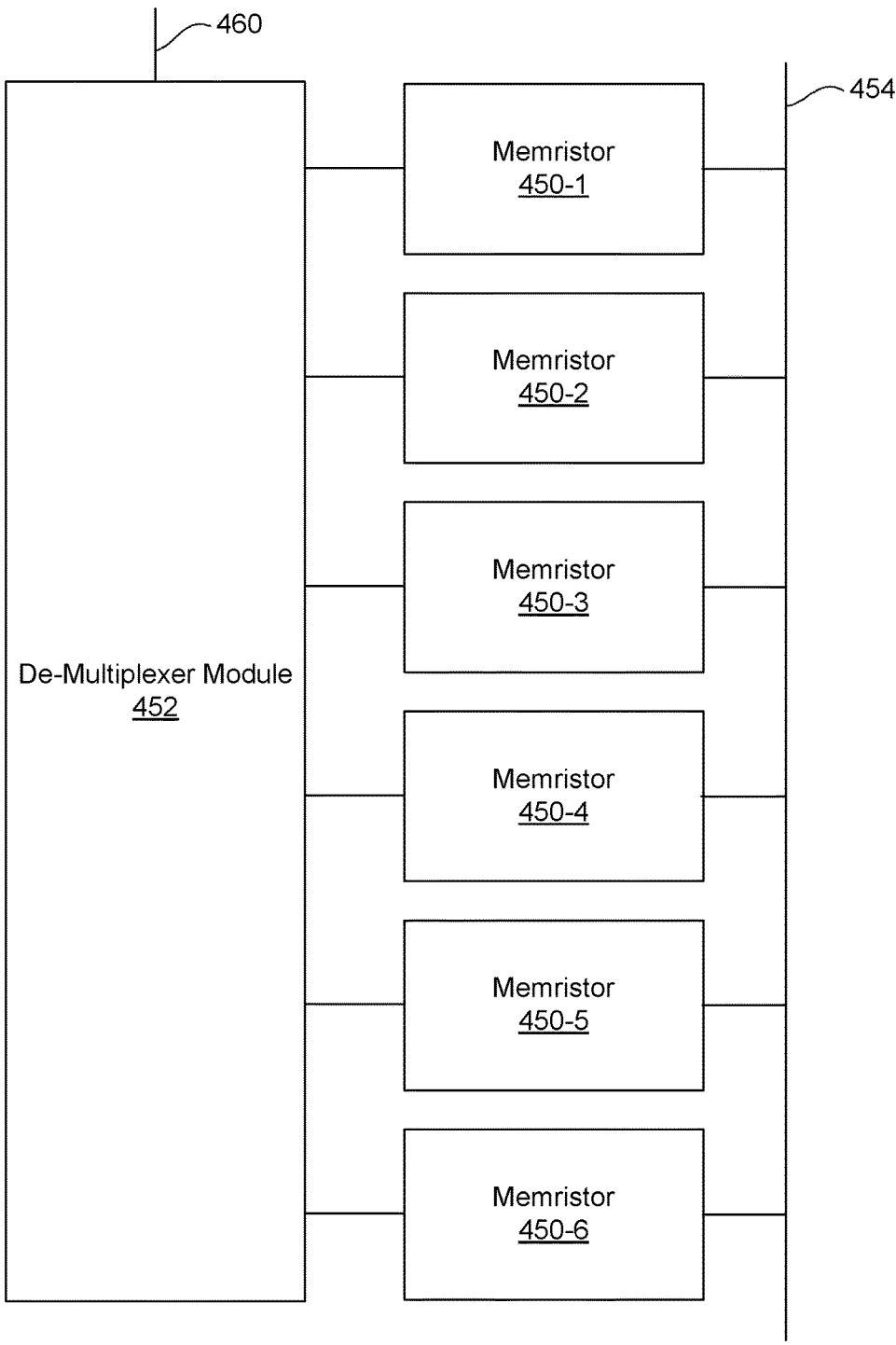
FIG. 4A is a block diagram of a single-dimensional memristor bank according to one example of the principles described herein.
Figure 4B:
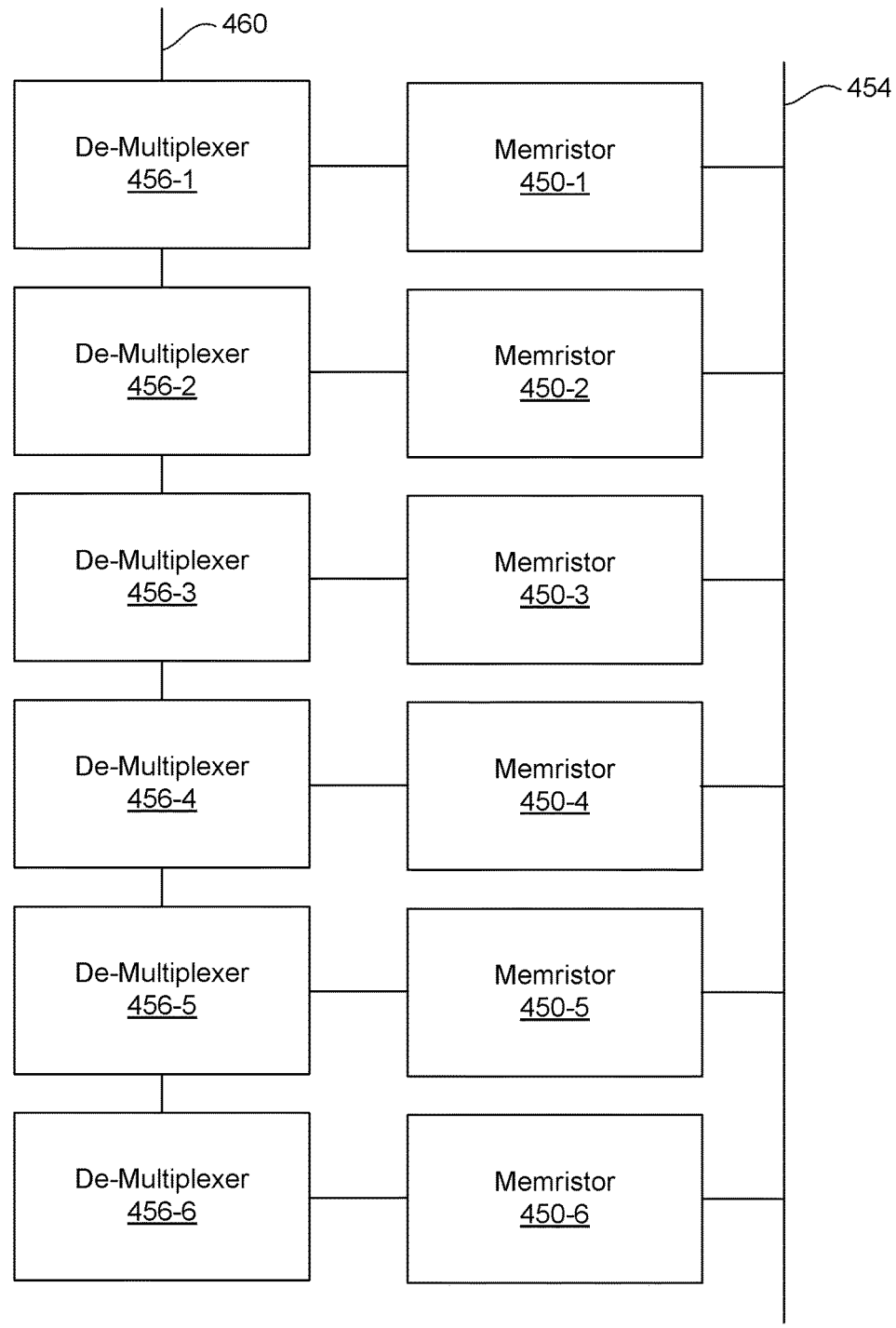
FIG. 4B is a block diagram of a single-dimensional memristor bank according to one example of the principles described herein.

FIGS. 4A and 4B are block diagrams of a single-dimensional memristor bank (348) according to one example of the principles described herein. As described above, the memristor array (FIG. 2, 240) may be divided up into a number of memristor banks (348) each memristor bank (348) including a grouping of memristors (450) and a de-multiplexer module (452). As used in the present specification, a de-multiplexer module (452) may refer to a component of the memristor bank (348) that receives a single input, i.e., a control signal (460), and generates a number of outputs, i.e., the output to select a particular memristor (450). The de-multiplexer module (452) in FIG. 4A may include a number of de-multiplexers (456-1, 456-2, 456-3, 456-4, 456-5, 456-6) as depicted in FIG. 4B. Examples of de-multiplexers (456) include shift registers, D latches, or flip-flops as will be described in more detail below.

Returning to FIGS. 4A and 4B, the memristor bank (348) may be coupled to a control line (454) to read data from, or write data to, the memristor (450). The memristor bank (348) may be a single-dimensional memristor bank (348). In other words, the memristors (450) in the memristor bank (348) may be arranged in a single dimension, such as a row or a column. In some examples, all the memristors (450) in a memristor bank (348) may be arranged in a single dimension. Each memristor (450) may be coupled to a de-multiplexer (456) which selectively activates a corresponding memristor (450). Put another way, each de-multiplexer (456) of the de-multiplexer module (452) may be independently paired with a memristor (450). For example, a first de-multiplexer (456-1) may be independently paired with a first memristor (450-1) and may be independent of other memristors (450-2, 450-3, 450-4, 450-5, 450-6). In this example, the number of de-multiplexers (456) in a memory bank (348) may be equal to the number of memristors (450) in a memory bank (348). Still further, the number of de-multiplexers (456) may similarly be organized in a single dimension. For example, as depicted in FIG. 4B, the memristors (450) may be organized in a single column and the de-multiplexers (456) may similarly be arranged in a single column that is parallel and adjacent to the memristors (450).

Returning to the de-multiplexer module (452), the de-multiplexer module (452) may receive a control signal (460) from the controller (FIG. 1, 106), which control signal (460) indicates that a particular de-multiplexer (456) is to selectively activate a corresponding memristor (450). In this way, a particular memristor (450) or group of memristors (450) may be activated, and subsequently read from, or written to via the control line (454).

The de-multiplexers (456) may be serially-connected. In other words, a control signal (460) received from the controller (FIG. 1, 106) may be passed from one de-multiplexer (456) to the next until a target memristor (450) is activated. More specifically, a control signal (460) may be received by a first de-multiplexer (456-1). The first de-multiplexer (456-1) may determine whether the control signal (460) indicates that the first memristor (450-1) is to be activated and may also pass the control signal (460) to the second de-multiplexer (456-2) which performs a similar operation. In other words, the input to the second de-multiplexer (456-2) is the output of the first de-multiplexer (456-1).

As depicted in FIGS. 4A and 4B, the number of de-multiplexers (456) may be disposed to the side of the number of memristors (450). In this fashion, the width of the memristor bank (348) is defined by the width of the memristor (450) and the width of the de-multiplexers (456). As the memristor bank (348) has a single-dimensional structure, the width of the memristor bank (348) is equal to roughly the width of a de-multiplexer (456) and a corresponding memristor (450). While FIG. 4B depicts six memristors (450-1, 450-2, 450-3, 450-4, 450-5, 450-6) and six de-multiplexers (456-1, 456-2, 456-3, 456-4, 456-5, 456-6), the memristor bank (348) may include any number of memristors (450) and de-multiplexers (456) as long as the memristor bank (348) is arranged in a single-dimensional structure.

The memristor bank (348) having a single-dimensional structure may be beneficial in that it may maintain the same amount of storage as another memristor bank (348) with a similar number of memristors (450) but in a reduced width, allowing the single-dimensional memristor bank (348) to be used on a printhead (FIG. 1, 116) with structural constraints that do not allow wide memristor banks (348) to be used. Moreover, as there are no crossing leads between memristors (450), a single-dimensional memristor bank (348) eliminates sneak current path issues that may arise in other geometries.

Figure 5A:
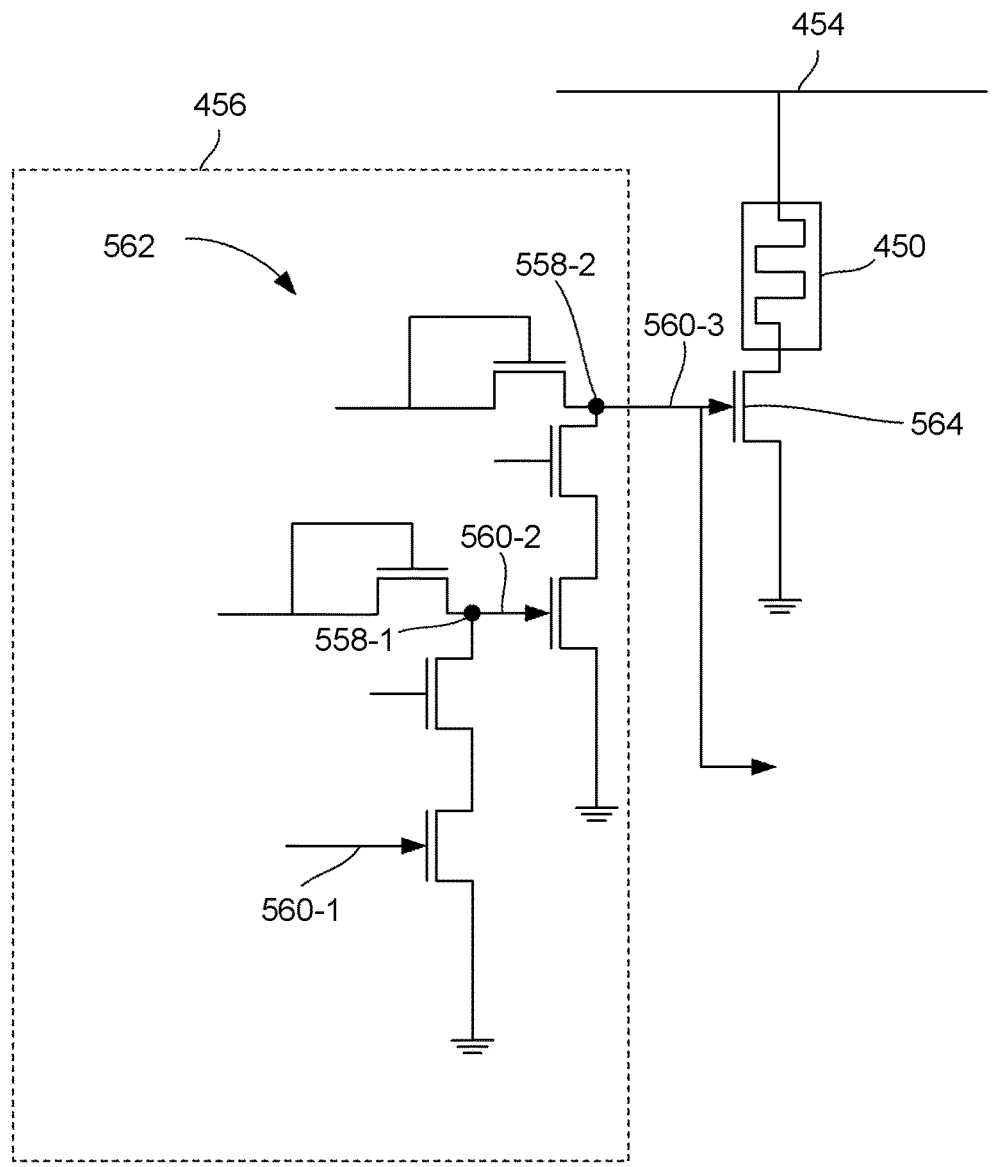
FIG. 5A is a circuit diagram of a memristor with a shift register de-multiplexer according to one example of the principles described herein.

FIG. 5A is a circuit diagram of a memristor (450) with a shift register (562) de-multiplexer (456) according to one example of the principles described herein. As described above, in some examples, the number of serially-connected de-multiplexers (456) are a number of shift registers (562) that are similarly serially-connected, of which the shift register (562) of FIG. 5A is an example. The shift registers (562) may be dynamic shift registers such that a signal is passed between the different shift registers (562) and the shift registers (562) may change in their ability to pass signals between one another. In other words, the input to one shift register (562) is the output from another shift register (562). Via the serially-connected shift registers (562), a control signal (FIG. 4, 460) may be passed among the shift registers (562) to selectively activate a particular memristor (450). For example, a first shift register (562) may receive a control signal (FIG. 4, 460) process the control signal (FIG. 4, 460) to determine whether to activate the memristor (450) and pass the control signal (FIG. 4, 460) onto a second, and subsequent, shift register (562).

In some examples, the shift register (562) may operate based on a number of timed clock signals. For example, different transistors that make up the shift register (562) may be opened or closed by sending voltage pulses to the gates of those transistors at different times. By opening and closing different transistors, the control signal (FIG. 4, 460) may or may not be passed to a selection transistor (564)

which activates or maintains inactive, the memristor (450) such that it may be accessed by a control line (454) such as the ID line. The control signal (FIG. 4, 460) may be passed to a subsequent shift register (562) such that a subsequent memristor (450) associated with the subsequent shift register (562) may be activated. An example of a shift register (562) selectively targeting a memristor (450) is given as follows.

In this example, a first node (558-1) may be set to an initial value, for example via a first clock pulse. An output (560-2) of the first node (558-1) may then be evaluated, via for example a second clock pulse, based on a received control signal (560-1) and the initial value of the first node (558-1) via for example a second clock pulse. The output (560-2) of the first node (558-1) may then be passed and used to generate an output (560-3) of a second node (558-2). Based on an initial value of the second node (558-2) set for example via a third clock pulse and the first output (560-2), the second node (558-2) output (560-3) may be evaluated, via for example a fourth clock pulse, and used to selectively target the memristor (450). When active, the memristor (450) may be either read from, or written to via a controller (FIG. 1, 106) connected to the memristor (450) via an ID line (454). The output (560-3) may also be passed to a subsequent shift register (562) to similarly determine whether or not to activate a different memristor (450). In this example, the input (FIG. 4, 460) of the subsequent shift register (562) is the output (560-3) from the present shift register (562).

Figure 5B:
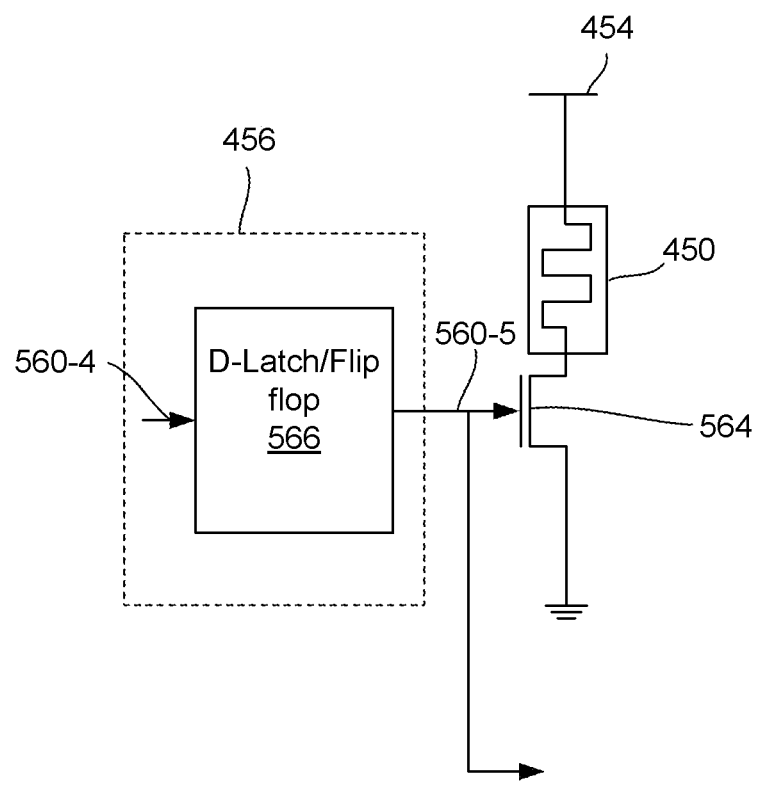
FIG. 5B is a circuit diagram of a memristor with a delay circuit de-multiplexer according to one example of the principles described herein.

FIG. 5B is a circuit diagram of a memristor (450) with a delay circuit de-multiplexer (456) according to one example of the principles described herein. As used in the present specification, the term delay circuit is meant to be broadly understood as delay circuitry to selectively activate the memristor (450). For example, the delay circuitry may be a D-latch that receives an input (560-4), from a controller (FIG. 1, 106) or other delay circuit for example, processes the input (560-4) and passes an output (560-5) to a selection transistor (564) that selectively activates the memristor (450) such that it may be accessed by the ID line (454). The output (560-5) may also be passed to a subsequent delay circuit to similarly selectively activate a subsequent memristor (450). Similarly, the delay circuitry may be a D-flip flop that receives an input (560-4) from a controller (FIG. 1, 106) for example, processes the input signal (560-4) and passes an output (560-5) to a selection transistor (564) that selectively activates the memristor (450). In FIG. 5B, the delay circuit is indicated as the D-latch/flip flop (566). While specific reference is made to a D-latch and D-flip flop, other types of delay circuits may be used such as SR-flip flops and JK-flip flops, among other types of delay circuits.

Figure 6:
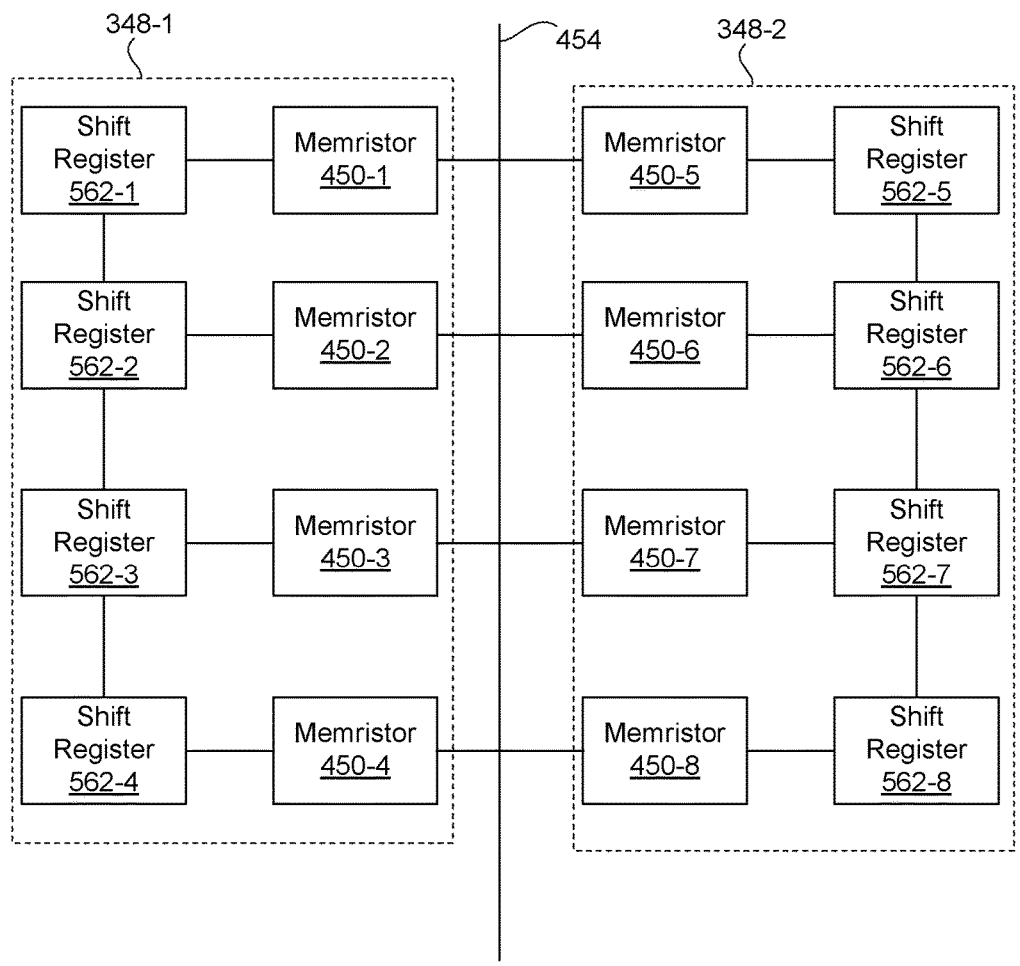
FIG. 6 is a block diagram of multiple single-dimensional memristor banks according to one example of the principles described herein.

FIG. 6 is a block diagram of multiple single-dimensional memristor banks (348-1, 348-2) according to one example of the principles described herein. As described above, a memristor array (FIG. 2, 240) may be divided into a number of single-dimensional memristor banks (348-1, 348-2). For example, a first memristor bank (348-1) may include a first number of memristors (450-1, 450-2, 450-3, 450-4) and a corresponding number of de-multiplexers (FIG. 4, 456) such as shift registers (562-1, 562-2, 562-3, 562-4). Similarly, a second memristor bank (348-2) may include a second number of memristors (450-5, 450-6, 450-7, 450-8) and a second number of de-multiplexers (FIG. 4, 456) such as shift registers (562-5, 562-6, 562-7, 562-8). The different memristor banks (348-1, 348-2) may share a control line (454) such as an ID line, such that a single ID line may write information to, or read information from, the memristors (450) in either memristor bank (348-1, 348-2).

A printer cartridge (FIG. 1, 114) and printhead (FIG. 1, 116) with a number of single-dimensional memristor banks (FIG. 3, 348) may have a number of advantages, including: (1) allowing for the construction of memristor arrays (FIG. 2, 240) that conform to design constraints imposed by a printhead (FIG. 1, 116); (2) eliminating sneak current issues in a memristor array (FIG. 2, 240); (3) improving printhead (FIG. 1, 116) memory performance; and (4) reducing cost of effective memory array fabrication.

Aspects of the present system are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (FIG. 1, 108) of the system (FIG. 1, 100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The preceding description has been presented to illustrate and describe examples of the principles described. This description is not intended to be exhaustive or to limit these principles to any precise form disclosed. Many modifications and variations are possible in light of the above teaching.

What is claimed is:

1. A printhead having a number of single-dimensional memristor banks, the printhead comprising:
   a number of nozzles to deposit an amount of fluid onto a print medium, each nozzle comprising:
      a firing chamber to hold the amount of fluid;
      an opening to dispense the amount of fluid onto the print medium; and
      an ejector to eject the amount of fluid through the opening; and
   a number of single-dimensional memristor banks, each memristor bank comprising:
      a number of memristors arranged in a single dimension; and
      a number of serially-connected de-multiplexers to selectively activate a target memristor of a memristor bank, in which:
         the number of serially-connected de-multiplexers is equal to the number of memristors; and
         an output of at least one de-multiplexer is an input into a subsequent de-multiplexer.

2. The printhead of claim 1, in which the fluid is inkjet ink.

3. The printhead of claim 1, in which the number of serially-connected de-multiplexers comprise a number of shift registers.

4. The printhead of claim 1, in which the number of serially-connected de-multiplexers comprises a delay circuit.

5. The printhead of claim 1, in which each de-multiplexer is independently paired with a memristor.

6. The printhead of claim 1, in which the number of serially-connected de-multiplexers pass a control signal between each other to selectively activate the target memristor.

7. The printhead of claim 1, in which a first de-multiplexer:
receives a control signal;
processes the control signal to generate an output; and
passes the output to a second de-multiplexer.

8. The printhead of claim 1, in which the number of serially-connected de-multiplexers are disposed to the side of the number of memristors.

9. A printer cartridge having a number of single-dimensional memristor banks, the printer cartridge comprising:
a fluid supply; and
a printhead to deposit fluid from the fluid supply onto a print medium, the printhead comprising:
a number of single-dimensional memristor banks, each single-dimensional memristor bank comprising:
a number of memristors; and
a number of serially-connected de-multiplexers to selectively activate a target memristor of a memristor bank, in which:
each de-multiplexer is independently paired with one of the number of memristors; and
an output of at least one de-multiplexer is an input into a subsequent de-multiplexer.

10. The cartridge of claim 9, in which:
the fluid is inkjet ink;
the printer cartridge is an inkjet printer cartridge; and
the printhead is an inkjet printhead.

11. The cartridge of claim 9, in which multiple memristor banks of the memristor array receive a signal from a shared control line.

12. The cartridge of claim 9, in which a width of the memristor array is defined by one memristor and one serially-connected de-multiplexer.

13. The cartridge of claim 9, in which the control signal is an input to a first serially-connected de-multiplexer which first serially-connected de-multiplexer processes the control signal and passes the control signal to a second serially-connected de-multiplexer.

14. The cartridge of claim 9, in which the number of serially-connected de-multiplexers comprises a delay circuit.

15. The cartridge of claim 9, in which the number of serially-connected de-multiplexers comprise a number of shift registers.

* * * * *